(12) United States Patent
Chang et al.

(10) Patent No.: US 6,906,342 B1
(45) Date of Patent: Jun. 14, 2005

(54) THIN FILM TRANSISTOR TYPE OPTICAL DETECTING SENSOR

(75) Inventors: Youn Gyoung Chang, Kunpo (KR); Jeong Hyun Kim, Kunpo (KR); Jae Kyun Lee, Anyang (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/466,961

(22) Filed: Dec. 20, 1999

(30) Foreign Application Priority Data

May 13, 1999 (KR) ........................ 1999-17169

(51) Int. Cl.[7] .............................................. H01L 29/04
(52) U.S. Cl. ........................ 257/59; 257/184; 257/187
(58) Field of Search ............................. 257/59, 53, 54, 257/57, 184, 187

(56) References Cited

U.S. PATENT DOCUMENTS

| 5,075,674 A | * | 12/1991 | Katayama et al. | ........... 340/719 |
| 5,466,620 A | * | 11/1995 | Bang | ........................ 438/159 |
| 5,656,824 A | * | 8/1997 | den Boer et al. | ............. 257/59 |
| 5,821,133 A | * | 10/1998 | Kawai et al. | ................. 438/30 |
| 5,895,936 A | * | 4/1999 | Lee | .............................. 257/59 |
| 6,072,559 A | * | 6/2000 | Kanemori et al. | .......... 349/192 |
| 6,195,138 B1 | * | 2/2001 | Shimada et al. | .............. 349/42 |

FOREIGN PATENT DOCUMENTS

| JP | 403157970-a | * | 7/1991 | .................. 438/73 |

* cited by examiner

*Primary Examiner*—Paul E Brock II
(74) *Attorney, Agent, or Firm*—McKenna Long & Aldridge LLP

(57) ABSTRACT

An optical detecting sensor includes a sensor thin film transistor generating an optical current in response to incident light reflected from an object; a storage capacitor storing charges of the optical current generated in the sensor thin film transistor; and a switch thin film transistor controlling release of the stored charges of the storage capacitor to an outer circuit for display of image of the object, having dual-layered source and drain electrodes of transparent conducting material and metal material, an active layer and a gate electrode. The switch thin film transistor further includes an ohmic contact layer on the active layer through which the dual-layered drain and source electrodes contact the active layer.

10 Claims, 4 Drawing Sheets

THIN FILM TRANSISTOR TYPE OPTICAL DETECTING SENSOR

This application claims the benefit of Korean Patent Application No. 99-17169, filed on May 13, 1999, which is hereby incorporated by reference.

BACKGROUND OF THE INVENTION

1. Field of the Invention

The present invention relates to an optical detecting sensor, and more particularly, to a thin film transistor (TFT) type optical detecting sensor that has a sensor TFT, and a switching TFT.

2. Discussion of the Related Art

The TFT type optical detecting sensor detects an image of an object by producing a detecting current in response to light reflected from the object. The sensor is comprised of a light source, a window which transmits light from the light source to the object, a sensor TFT which generates an optical current in accordance to the amount of the light reflected from the object, a storage capacitor which stores charges of the optical current generated in the sensor TFT, and a switching TFT which controls the release of charges of the storage capacitor to an external circuit.

Since the sensor TFT and the switch TFT are comprised of similar elements, in making the detecting sensor, the active layers for the sensor TFT and the switching TFT are preferably deposited and patterned at the same time. The active layer for the sensor TFT should be chosen among the materials that are sensitive to light and active in converting light into current. Also the active layer of the switching TFT should be proper for the switching operation. Thus, to satisfy both conditions, the active layer for the TFTs is preferably an amorphous silicon layer having hydrogen (a-Si:H, hereinafter referred as "amorphous silicon layer").

Since the switching TFT is operated by a voltage applied to a gate of the switching TFT, not by the light, the active layer of the switching TFT should be shielded from light, whereas the active layer of the sensor TFT generates optical current by the incident light reflected from the object.

FIG. 1 is a schematic sectional view of a conventional optical detecting sensor, which can explain a manufacturing process.

First, on a transparent and insulating substrate 10, regions for a window, a sensor TFT, a storage capacitor, and a switching TFT should be defined as the areas "D", "C", "B" and "A", respectively, in advance.

A first conducting metal layer is deposited on the substrate 10 and patterned into a sensor gate electrode 11, a first capacitor electrode 13 and a switch gate electrode 15 in the corresponding areas, respectively.

A first insulating layer is deposited on the substrate 10 while covering the patterned conducting metal layer.

An amorphous silicon layer and an n+ amorphous silicon layer are deposited in succession on the first insulating layer to form sensor and switch active layers 19 and 21 and ohmic contact layers 23 and 25 for the corresponding active layers 19 and 21, respectively.

A second conducting metal layer is deposited on the first insulating layer and patterned into sensor source and drain electrodes 27a and 27b, a second capacitor electrode 29 and switch source and drain electrodes 31a and 31b. The second conducting metal layer may be made of a general non-transparent metal or a transparent conducting material, for example, indium tin oxide.

A second insulating layer 33 is deposited on the second conducting metal layer and the exposed portion of the active layers 19 and 21. Then a light shielding layer 35 is formed on the second insulating layer 33 over the switch active layer 21.

The contact portion between switch drain electrode 31b and the switch active layer 21 is shown in detail in FIG. 2, which is an enlarged view of portion "J" of FIG. 1.

The upper portion of the switch active layer indirectly contacts the switch drain electrode 31b through the ohmic contact layer 25 that restricts the hole current flow, whereas the side portion "w" of the switch active layer 21 directly contacts the switch drain electrode 31b. Since there is no ohmic contact layer in the side contact area "w" of the switch active layer 21, the leakage current to the switch drain electrode 31b is bigger than in the upper contact portion of the switch active layer 21, resulting in an adverse affect on the operation characteristics of the switch TFT.

FIG. 3 shows the relationship between gate voltage $V_{G2}$ for switching TFTs having drain electrodes made of different materials and drain current $I_D$. If the drain electrode is made of transparent conducting material, as illustrated in solid line 36, the leakage current (or off-current) and the on-current are low, since resistance of the transparent conducting material is relatively high, which means that there is a small current gap between negative and positive voltage of gate electrode. If the drain electrode is made of a non-transparent metal, as illustrated in the dot-dash line 34, both the off-current and the on-current are relatively high, also resulting in a small gap between the off-current and on-current.

SUMMARY OF THE INVENTION

Accordingly, the present invention is directed to an optical detecting sensor having a switch TFT with reduced off-current and increased on-current that substantially obviates one or more of the problems due to limitations and disadvantages of the related art.

An object of the present invention is to provide an optical detecting sensor having a switch with good operation characteristics.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

To achieve these and other advantages and in accordance with the purpose of the present invention, as embodied and broadly described, an optical detecting sensor includes a sensor thin film transistor (TFT) generating optical current by incident light reflected from an object; a storage capacitor storing charges of the optical current generated in the sensor thin film transistor; and a switching TFT controlling the release of the stored charges of the storage capacitor to an external circuit for display of an image of the object, the switching TFT having dual-layered source and drain electrodes of transparent conducting material and metal material, an active layer and a gate electrode.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIG. 5 is an enlarged view of portion "P" of FIG. 4a; and

DETAILED DESCRIPTION OF THE PREFERRED EMBODIMENTS

Reference will now be made in detail to a preferred embodiment of the present invention, an example of which is illustrated in the accompanying drawings.

Figure 1:
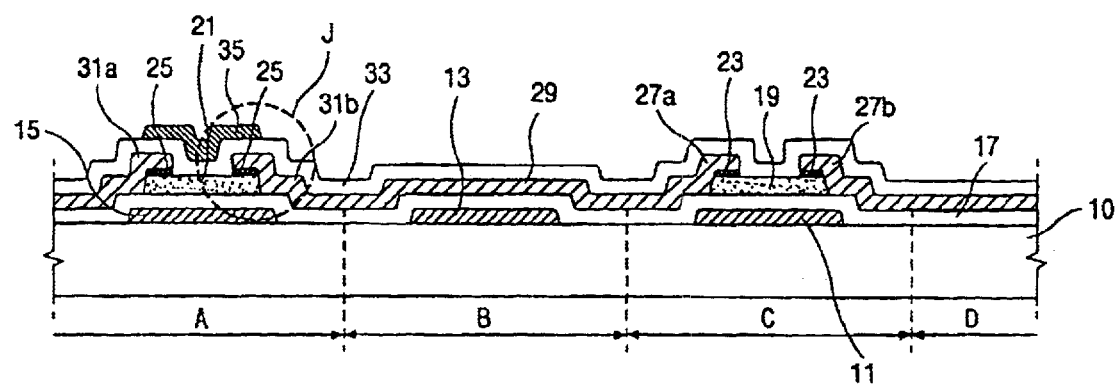
FIG. 1 is a sectional view of an optical detecting sensor according to the prior art.
Figure 2:
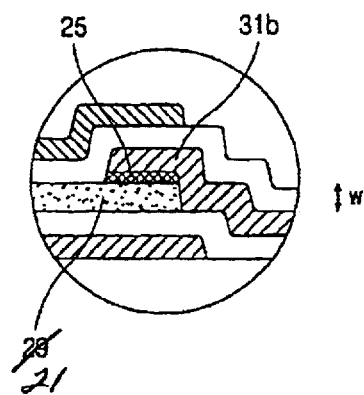
FIG. 2 is an enlarged view of portion "J" of FIG. 1.
Figure 3:
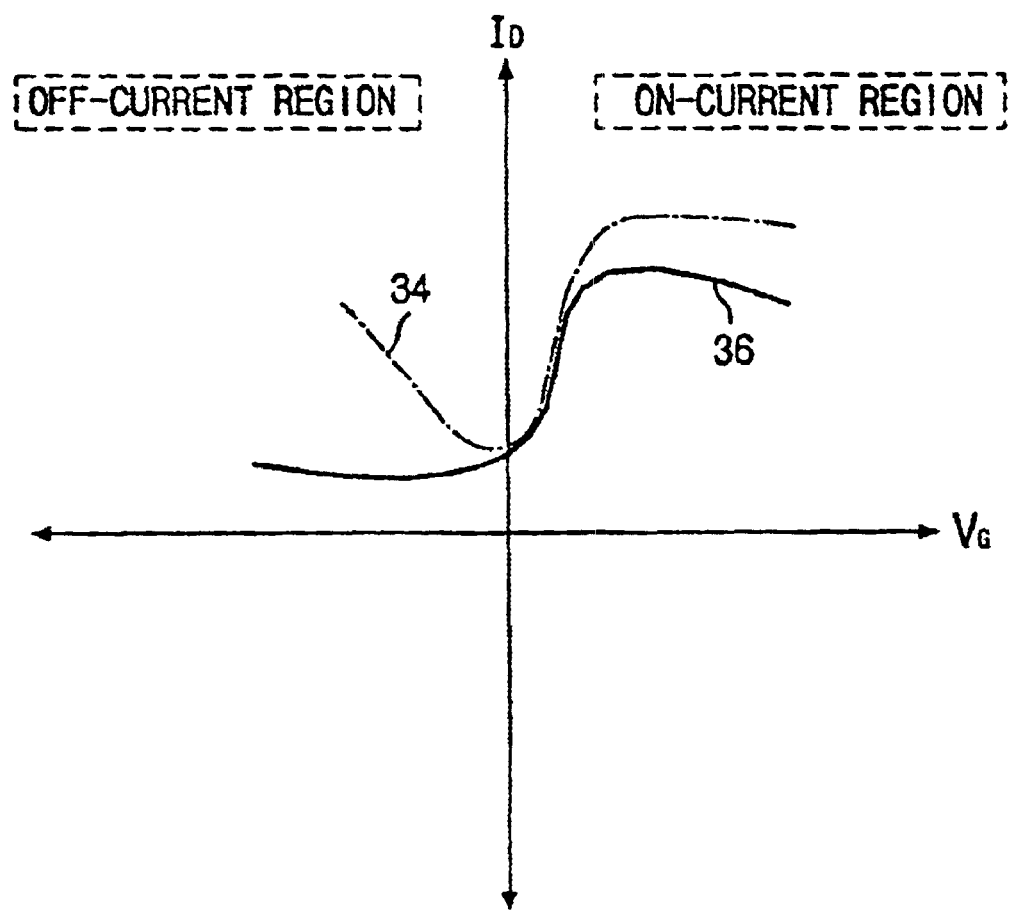
FIG. 3 is a graph illustrating the relationship between gate voltage $V_G$ and drain current $I_D$ for a switching TFT with a non-transparent metal drain electrode and for a switching TFT with a transparent conducting material drain electrode.
Figure 4A:
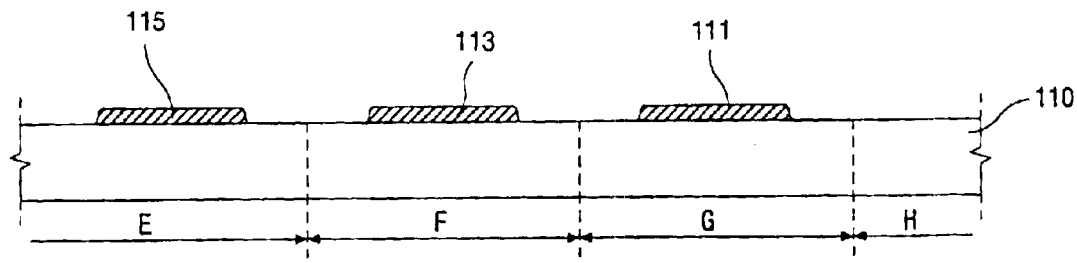
FIGS. 4a to 4c are sectional views illustrating a process of manufacturing an optical detecting sensor according to the present invention.
Figure 4B:
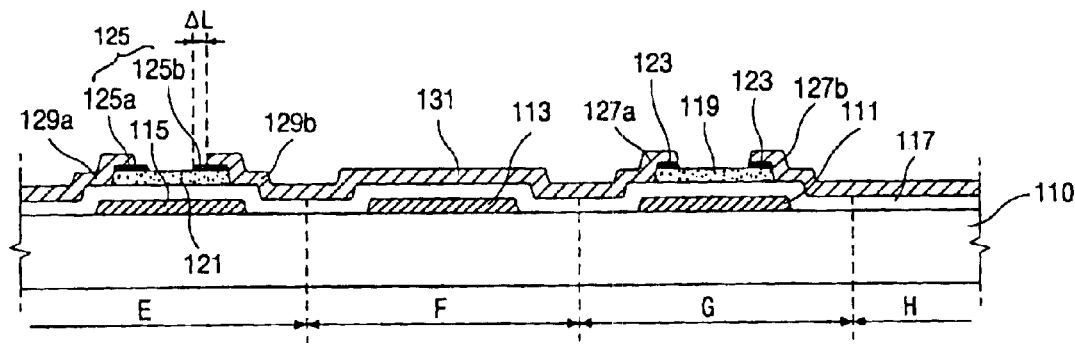
Figure 4C:
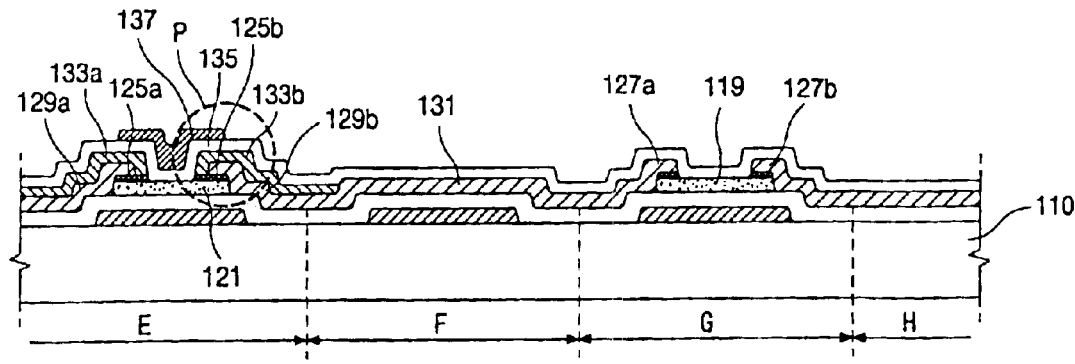

FIGS. 4a to 4c illustrate a process of manufacturing an optical detecting sensor according to an embodiment of the present invention. On a transparent substrate 110, regions for a switching TFT, a storage capacitor, a sensor TFT, and a window are defined as "E", "F", "G", and "H", respectively. A conducting metal layer is deposited on the substrate 110 and patterned into a sensor gate 111, a first capacitor electrode 113, and a switch gate 115 in the corresponding regions, as shown in FIG. 4a. The conducting metal is preferably selected from the group consisting of molybdenum (Mo), tungsten (W) and aluminum (Al).

As shown in FIG. 4b, a first insulating layer 117, which is preferably one of the group consisting of aluminum oxide ($Al_2O_x$), silicon oxide ($SiO_x$) and tantalum oxide ($TaO_x$), is deposited on the substrate 110 while covering the switch gate 115, the first capacitor electrode 113 and the sensor gate 111. An amorphous silicon layer and an n+ amorphous layer are deposited on the first insulating layer 117 in succession to form switch and sensor active layers 121 and 119, and switch and sensor ohmic contact layers 125 and 123 over switch and sensor gates 115 and 111, respectively. Switch and sensor active layers 121 and 119 are preferably smaller than the switch and sensor gates 115 and 111, respectively, in order to protect the active layers 121 and 119 from the light of a light source (not shown) under the substrate 110. A transparent conducting material is deposited thereon to form switch source and drain electrodes 129a and 129b, a second capacitor electrode 131 and sensor source and drain electrodes 127a and 127b. In the thin film transistor optical detecting sensor, since it is desirable that light from the light source positioned under the substrate 110 should be transmitted to an object over the substrate through the substrate 110, especially through the window area "H" as much as possible, a transparent conducting material such as indium tin oxide is used.

Also, the switch source and drain electrodes 129a and 129b do not cover the whole ohmic contact layers 125, as shown in FIG. 4b, and each ohmic contact layer 125a and 125b for switch source and drain electrodes 129a and 129b has an exposed portion "ΔL".

Referring to FIG. 4c, subsidiary switch source and drain electrodes 133a and 133b made of a non-transparent metal are formed on the switch source and drain electrodes 129a and 129b while contacting the exposed portions "ΔL" of the ohmic contact layers 125a and 125b, respectively. Thus, the switch drain and source electrodes have a dual layered structure. As shown in FIG. 4c, the non-transparent metal layer of the dual layered drain electrode of the switch TFT extends over the transparent conductive material layer and contacts the ohmic contact layer. In addition, the extended edge of the non-transparent metal layer of the dual layered drain electrode of the switch TFT substantially coincides with one of the edges of the ohmic contact layer. The non-transparent metal is selected from the group consisting of tungsten, molybdenum and chrome, each of which has a lower contact resistance than the transparent conducting material such as indium tin oxide.

The second insulating layer 135 is deposited on the whole surface of the substrate 110, after forming the subsidiary switch source and drain electrodes 133a and 133b. A light shielding layer is formed thereon over the switch active layer 121.

Figure 5:
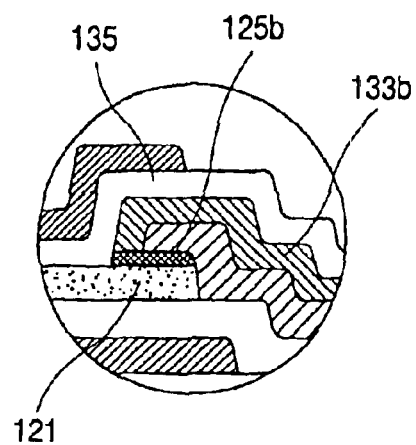

Referring to FIG. 5 which is an enlarged view of portion "P" of FIG. 4c, the contact structure between the ohmic contact layer 125b and the dual layered drain electrode is explained in detail. For an optical detecting sensor, the drain and source electrodes of the switching TFT should employ the transparent conducting material. But according to the embodiment of the invention, the drain and source electrodes have a dual layered structure of transparent material electrode 129b(129a) and non-transparent metal electrode 133b(133a). The transparent material can function as a hole barrier layer between the semiconductor layer and the source and/or drain electrode(s). Thus, the OFF-current or leakage current can be reduced by adopting the transparent electrode 129b(129a), while the ON-current can be maintained by the non-transparent metal electrode 133b(133a).

Figure 6:
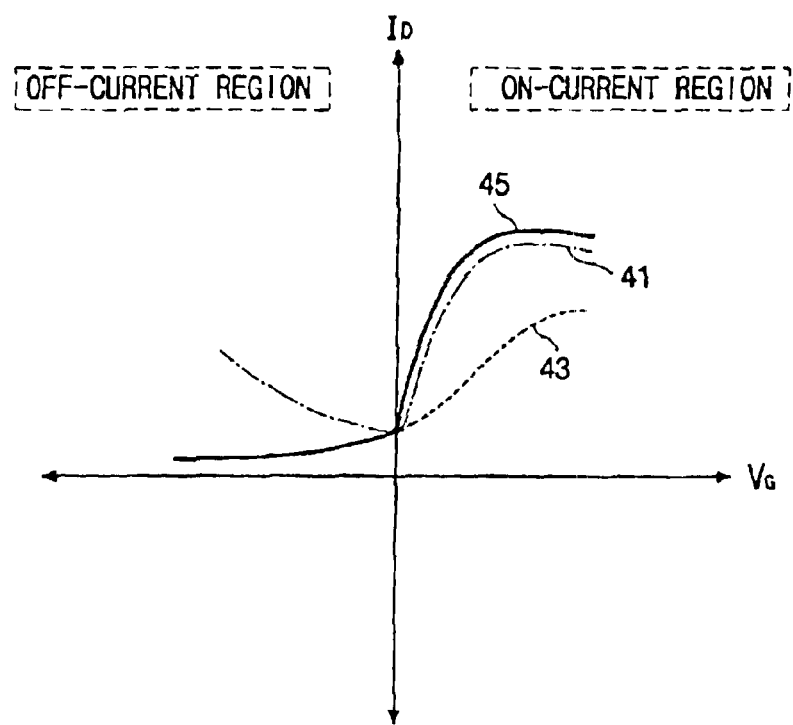
FIG. 6 is a graph illustrating the relationship between gate voltage $V_G$ and drain current $I_D$, a switching TFT with a non-transparent metal drain electrode, a switching TFT with a transparent conducting material drain electrode, and a switching TFT having the drain electrode according to the present invention.

FIG. 6 is a transfer curve which shows the relationship between gate voltage $V_G$ and drain current ID for switching TFTs whose drain electrode is made of a non-transparent metal (dot-dashed line), a transparent conducting material (dashed line) and the dual-layered drain electrode (solid line) according to the present invention.

The dual-layered drain electrode 45 according to the present invention has a characteristic such that in the negative gate voltage region, the off-current or leakage current, which is desired to be as low as possible, is almost the same as that of the transparent conducting material drain electrode 43, whereas the on-current, which is desired to be as high as possible, is almost the same as that of the non-transparent metal drain electrode 41.

Therefore, since the thin film transistor optical detecting sensor according to the present invention has a switching thin film transistor having dual-layered source/drain electrodes, the switching characteristics can be improved.

It will be apparent to those skilled in the art that various modifications and variation can be made in the thin film transistor type optical detecting sensor of the present invention without departing from the scope of the invention. Thus, it is intended that the present invention covers the modifications and variations of this invention provided they come within the scope of the appended claims and their equivalents.

What is claimed is:

1. An optical detecting sensor, comprising:
a sensor thin film transistor (TFT) generating optical current, the sensor TFT having source and drain electrodes;
a storage capacitor storing charges of the optical current generated in the sensor thin film transistor; and
a switching TFT controlling a release of the stored charges, the switching TFT having a gate electrode, an insulating layer on the gate electrode, an active layer on the insulating layer, an ohmic contact layer on the active layer, and dual layered source and drain electrodes that are each comprised of a transparent conductive material and a metal material, at least one layer of the dual layered drain electrode of the switching TFT connected to the source electrode of the sensor TFT,
wherein both of the transparent conductive material and the metal material of the dual layered source and drain electrodes contact the ohmic contact layer.

2. An optical detecting sensor according to claim 1, wherein the metal material is selected from a group consisting of tungsten, chrome and molybdenum.

3. An optical detecting sensor according to claim 1, wherein the transparent conducting material is indium tin oxide.

4. An optical detecting sensor according to claim 1, wherein the metal material is a substantially non-transparent metal material.

5. A thin film transistor (TFT) sensor, comprising:
a sensor TFT having a gate electrode and spaced apart first and second sensor electrodes; and
a switching TFT comprised of:
a gate electrode on a transparent substrate;
an insulating layer over the gate electrode;
a semiconductor layer on the insulating layer and adjacent the gate electrode, wherein the semiconductor layer includes an active layer and an ohmic contact layer;
spaced apart first and second switching electrodes on the semiconductor layer that define a channel region, wherein the second switching electrode electrically contacts the contact layer; and
a storage capacitor having a first storage electrode and a second storage electrode, wherein the second storage electrode of the storage capacitor connects to the first sensor electrode and to the second switching electrode;
wherein the first and second switching electrodes have a dual layer structure comprised of a transparent conducting layer and a non-transparent metal layer, both of which are in contact with the ohmic contact layer, and at least one layer of the second switching electrode is connected to the first sensor electrode.

6. A thin film transistor (TFT) sensor according to claim 5, wherein the transparent conducting layer contacts a side of the active layer.

7. An optical detecting sensor, comprising:
a sensor thin film transistor (TFT) generating optical current;
a storage capacitor storing charges of the optical current generated in the sensor thin film transistor; and
a switching TFT controlling a release of the stored charges, the switching TFT having a gate electrode, an insulating layer on the gate electrode, an active layer on the insulating layer, source and drain ohmic contact layers on the active layer, and dual layered source and drain electrodes that are each comprised of a transparent conductive layer and a metal layer,
wherein the metal layer of the dual layered drain electrode of the switching TFT extends over the transparent conductive layer and contacts the drain ohmic contact layer, and the extended edge of the metal layer of the dual layered drain electrode of the switching TFT substantially coincides with one of the edges of the drain ohmic contact layer.

8. An optical detecting sensor according to claim 7, wherein the metal layer is selected from a group consisting of tungsten, chrome and molybdenum.

9. An optical detecting sensor according to claim 7, wherein the transparent conducting layer is indium tin oxide.

10. An optical detecting sensor according to claim 7, wherein the metal layer is a substantially non-transparent metal layer.

* * * * *